United States Patent [19]

Nishida

[11] Patent Number: 5,744,985
[45] Date of Patent: Apr. 28, 1998

[54] DIFFERENTIAL SAMPLE-HOLD CIRCUIT

[75] Inventor: Yoshio Nishida, Tokyo, Japan

[73] Assignee: NEC Corporation, Tokyo, Japan

[21] Appl. No.: 867,760

[22] Filed: Jun. 3, 1997

Related U.S. Application Data

[63] Continuation of Ser. No. 509,460, Jul. 31, 1995, abandoned.

[30] Foreign Application Priority Data

Jul. 29, 1994 [JP] Japan .................... 6-178973

[51] Int. Cl.$^6$ .................................... G11C 27/02
[52] U.S. Cl. .................................... 327/94; 327/96
[58] Field of Search ................... 327/91, 93, 94, 327/95, 96, 100; 341/144, 155, 110

[56] References Cited

U.S. PATENT DOCUMENTS

| | | | |
|---|---|---|---|
| 4,370,572 | 1/1983 | Cosand et al. | 307/353 |
| 4,585,956 | 4/1986 | Lie | 327/95 |
| 5,304,866 | 4/1994 | Uranaka | 327/95 |
| 5,369,309 | 11/1994 | Bacrania et al. | 327/94 |
| 5,376,899 | 12/1994 | Pass | 330/253 |
| 5,389,833 | 2/1995 | Kay | 327/96 |
| 5,416,432 | 5/1995 | Lewis et al. | 327/94 |

FOREIGN PATENT DOCUMENTS

| | | | |
|---|---|---|---|
| 000594242 A2 | 4/1994 | European Pat. Off. | 327/96 |
| 37 21 059 | 1/1989 | Germany . | |
| 42 18 619 | 2/1993 | Germany . | |
| 405290595 A | 11/1993 | Japan | 327/95 |
| 2069267 | 8/1981 | United Kingdom . | |
| WO 91/15899 | 10/1991 | WIPO . | |

OTHER PUBLICATIONS

"Sample and hold circuit", Technical Disclosure Bulletin, Mar. 1968, vol. 10 No. 10, pp. 1608–1609.
The Institute of Electronics, Information and Communication Engineers, Technical Report of IEICE, ED93–47, ICD 93–46, pp. 17–22, (1993).
M. Nayebi et al., "A 10–bit Video BiCMOS Track-and-Hold Amplifier", IEEE Journal of Solid-State Circuits, No. 6, Dec. 24, 1989, pp. 1507–1516.

*Primary Examiner*—Timothy P. Callahan
*Assistant Examiner*—My-Trang Nu Ton
*Attorney, Agent, or Firm*—Foley & Lardner

[57] ABSTRACT

In a differential sample-hold circuit used in a serial-parallel type A/D conversion circuit containing a current-added type D/A converter, a pair of differential analog input voltages Vin1 and Vin2 are supplied to a non-inverting input and an inverting input of a buffer amplifier. An non-inverted output and an inverted output of the buffer amplifier are supplied through a pair of switches to one end of a pair of voltage holding capacitors having their other end connected to ground, respectively, and also to an input of a pair of closed-loop buffer amplifiers having their outputs for outputting a pair of differential sampled-and-held voltages.

18 Claims, 5 Drawing Sheets

DIFFERENTIAL SAMPLE-HOLD CIRCUIT

This application is a continuation, of application Ser. No. 08/509,460, filed Jul. 31, 1995, now abandoned.

BACKGROUND OF THE INVENTION

1. Field of the invention

The present invention relates to a differential sample-hold circuit, and more specifically to a differential sample-hold circuit for use in a serial-parallel type A/D (analog-to-digital) converter.

2. Description of Related Art

Referring to FIG. 1, there is shown a circuit block diagram of one example of a conventional A/D conversion circuit which can realize a high operation speed, high precision, A/D conversion for processing an image signal and the like. The conventional A/D conversion circuit ordinarily used is of a serial-parallel type in which an input signal is analog-to-digital converted by two full-parallel A/D converters 42 and 45 for a most significant part and a least significant part, respectively.

More specifically, the A/D conversion circuit shown in FIG. 1 includes a sample-hold circuit 41 having an input terminal for receiving an analog input voltage Vin and an output terminal for outputting a sampled-and-held analog signal $V_{SH}$, a full-parallel A/D converter 42 having an input connected to the output terminal of the sample-hold circuit 41 and an output for generating a digital output MSB for the most significant part, and a D/A (digital-to-analog) converter 43 having an input connected to the output of the full-parallel A/D converter 42 and an output for outputting an analog signal $V_{DAC}$ obtained from the digital output MSB for the most significant part. The A/D conversion circuit shown in FIG. 1 also includes an analog subtracter 44 having a positive input terminal connected to the output $V_{SH}$ of the sample-hold circuit 41 and a negative input terminal connected to the output $V_{DAC}$ of the D/A converter 43, for outputting the result $V_{SUBT}$ of the analog subtraction, and another full-parallel A/D converter 45 having an input connected to an output $V_{SUBT}$ of the subtracter 44 and an output for generating a digital output LSB for the least significant part.

Now, operation of the A/D conversion circuit shown in FIG. 1 will be described. The sampled-and-hold circuit 41 receives the analog input voltage Vin for sampling and holding the received voltage Vin, and outputs the sample-hold voltage $V_{SH}$. The first full-parallel A/D converter 42 coarsely analog-to-digital converts the received sampled-and-held $V_{SH}$ for generating the digital output MSB of the most significant part. This digital output MSB is digital-to-analog converted to be returned to the analog voltage $V_{DAC}$ corresponding to the the digital output MSB. The subtracter 44 generates a difference voltage $V_{SUBT}$ between the sampled-and-held voltage $V_{SH}$ and the re-converted analog voltage $V_{DAC}$. The difference voltage $V_{SUBT}$ is finely analog-to-digital converted by the second full-parallel A/D converter 45, which generates the digital output LSB of the least significant part. The digital output MSB of the most significant part and the digital output LSB of the least significant part are combined to form a complete digital data precisely corresponding to the sampled-and-held voltage $V_{SH}$.

In the above mentioned serial-parallel type A/D conversion circuit, the characteristics of the sample-hold circuit substantially determines the overall performance of the serial-parallel type A/D conversion circuit. Therefore, the sample-hold circuit having a high operation speed and a high precision has been required. In the prior art, in order to realize the sample-hold circuit having a high operation speed and a high precision, one approach adopts a differential method in which the input signal is processed in a differential manner. This type of sample-hold circuit is disclosed in U.S. Pat. No. 4,370,572 and the 1993 Technical Report of IEICE, ED93-47, ICD93-46, pages 17–22. The disclosure of these publications is incorporated by reference in their entirety into the present application. This type of sample-hold circuit is mainly constituted of differential buffer amplifiers, two switches having the same circuit construction, and two voltage holding capacitors having the same capacitance.

Referring to FIG. 2, there is shown one example of this type of sample-hold circuit in the prior art.

The sample-hold circuit shown in FIG. 2 includes a first differential buffer amplifier 51 having a non-inverting input and an inverting input receiving an analog input voltage Vin1 and an analog input voltage Vin2, respectively, which constitute a pair of differential analog input voltages, a first switch 12 having one end connected to a non-inverted output of the differential buffer amplifier 51, and a second switch 12 having one end connected to an inverted output of the differential buffer amplifier 51. The sample-hold circuit shown in FIG. 2 also includes a first voltage holding capacitor 13 having its one end connected to the other end of the switch 12 and its other end connected to ground, a second voltage holding capacitor 15 having its one end connected to the other end of the switch 14 and its other end connected to ground, these first and second capacitors having the same capacitance, and a second differential buffer amplifier 52 having a non-inverting input and an inverting input connected to the other end of the first and second switches 12 and 14, respectively, and having a non-inverted output and an inverted output for outputting a pair of sampled-and-held voltages $V_{SH1}$ and $V_{SH2}$, respectively.

The sample-hold circuit shown in FIG. 2 operates as follows: The switches 12 and 14 are closed and opened in synchronism with each other. When the switches 12 and 14 are in a closed condition, the voltage holding capacitors 13 and 15 are charged or discharged to the analog input voltages Vin1 and Vin2, respectively, by action of the differential buffer amplifier 51 having its gain of 1 (input voltage sampling period or mode). When the switches 12 and 14 are opened, the analog voltages at the moment the switches 12 and 14 are brought into an open condition are held in the voltage holding capacitors 13 and 15, respectively (start of input voltage holding period or mode). On the other hand, the sampled-and-held voltage of the voltage holding capacitors 13 and 15, are supplied from the differential buffer amplifier 52 to the following full-parallel A/D converter 42 and the subtracter 44 shown in FIG. 1.

Thus, the sample-hold circuit shown in FIG. 2 processes the signal in the differential manner by using the two differential buffer amplifiers 51 and 52, the pair of switches 12 and 14 and the pair of voltage holding capacitors 13 and 15. Therefore, the circuit is scarcely influenced by noises generated by the opening and closing of the switches and a voltage variation caused by a leak of an electric charge from the capacitors when the switches are in the open condition.

However, when the sample-hold circuit shown in FIG. 2 is used in the serial-parallel type A/D conversion circuit, and the D/A converter 43 is constituted of a unitary current added type D/A converter in order to realize a high speed operation, an output current of the D/A converter varies in accordance with the values of the analog input voltages Vin1 and Vin2. Since this output current is picked up from the output terminal as a load current, the output voltages VSH1 and VSH2 are distorted. As a result, a high precision A/D conversion circuit cannot be obtained.

SUMMARY OF THE INVENTION

Accordingly, it is an object of the present invention to provide a differential sample-hold circuit which has overcome the above mentioned defect of the conventional one.

Another object of the present invention is to provide a differential sample-hold circuit capable of instantaneously compensating a variation in an output voltage caused by a load current variation when a current-added type D/A converter is incorporated in a serial-parallel type A/D conversion circuit.

The above and other objects of the present invention are achieved in accordance with the present invention by a differential sample-hold circuit comprising:

- a buffer amplifier having first and second input terminals for receiving a pair of analog input voltages, and first and second output terminals;
- a first switch having an input terminal connected to the first output terminal of the buffer amplifier;
- a second switch having an input terminal connected to the second output terminal of the buffer amplifier;
- a first voltage holding capacitor having its one end connected to an output terminal of the first switch and its other end connected to ground;
- a second voltage holding capacitor having its one end connected to an output terminal of the second switch and its other end connected to ground;
- a first closed-loop buffer amplifier having its input terminal connected to the one end of the first voltage holding capacitor, and its output terminal constituting a first output terminal for a first sampled-and-held value; and
- a second closed-loop buffer amplifier having its input terminal connected to the one end of the second voltage holding capacitor, and its output terminal constituting a second output terminal for a second sampled-and-held value.

In one embodiment, the first and second input terminals of the buffer amplifier are a non-inverting input terminal and an inverting input terminal, respectively, and the first and second output terminals of the buffer amplifier are a non-inverted output terminal and an inverted output terminal, respectively.

In another embodiment, the buffer amplifier includes first and second buffer amplifier circuits, the first input terminal and the first output terminal of the buffer amplifier being constituted of an input terminal and an output terminal of the first buffer amplifier circuit, respectively, and the second input terminal and the second output terminal of the buffer amplifier being constituted of an input terminal and an output terminal of the second buffer amplifier circuit, respectively.

In addition, for example, each of the closed-loop buffer amplifiers is constituted of an operational amplifier, which has a non-inverting input constituting the input terminal of the closed-loop buffer amplifier, and which is connected in a voltage follower fashion in which an output terminal of the operational amplifier is connected to an inverting input terminal of the operational amplifier.

In the above mentioned differential sample-hold circuit, since the first and second closed-loop buffer amplifiers are located before a pair of differential output terminals of the sample-hold circuit, when a current-added type D/A converter is incorporated in a serial-parallel type A/D conversion circuit, it it possible to instantaneously compensate a variation in an output voltage caused by a load current variation, by means of a feedback action of the closed-loop buffer amplifier. As a result, the output voltage distortion can be minimized.

The above and other objects, features and advantages of the present invention will be apparent from the following description of preferred embodiments of the invention with reference to the accompanying drawings.

DESCRIPTION OF THE PREFERRED EMBODIMENTS

Figure 2:
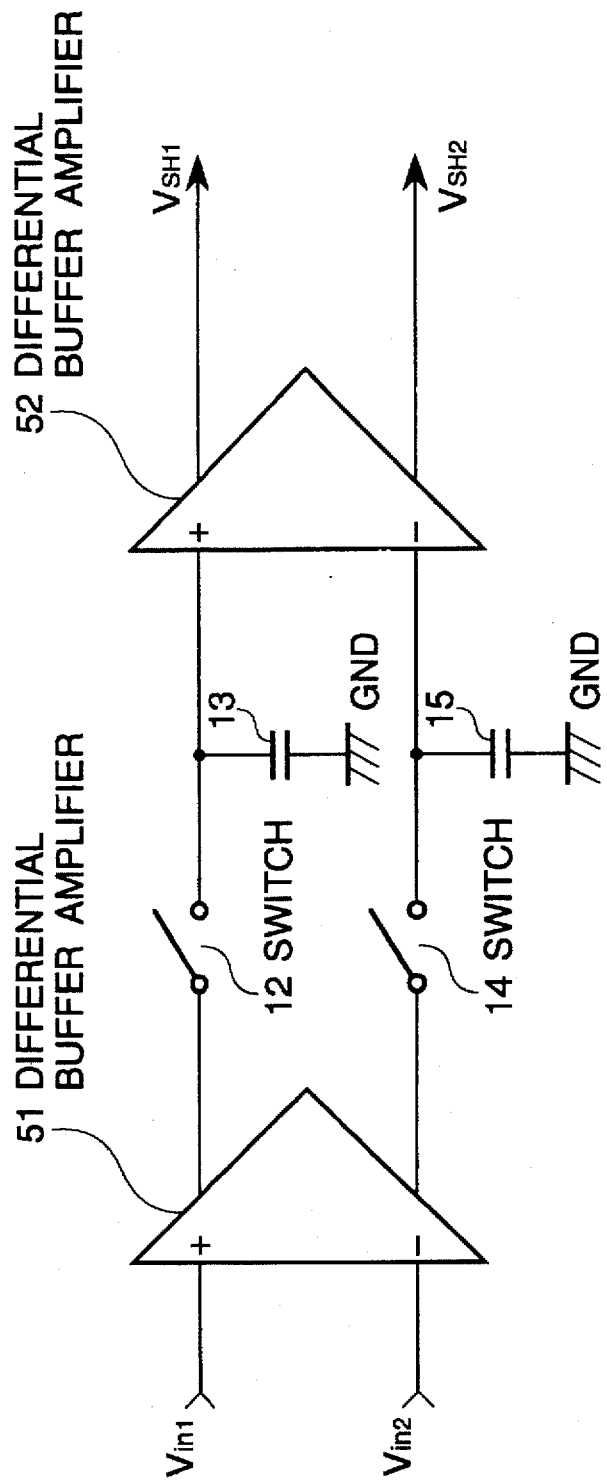
FIG. 2 is a circuit block diagram of one example of the differential sample-hold circuit in the prior art, used in the serial-parallel type A/D conversion circuit shown in FIG. 1.
Figure 3:
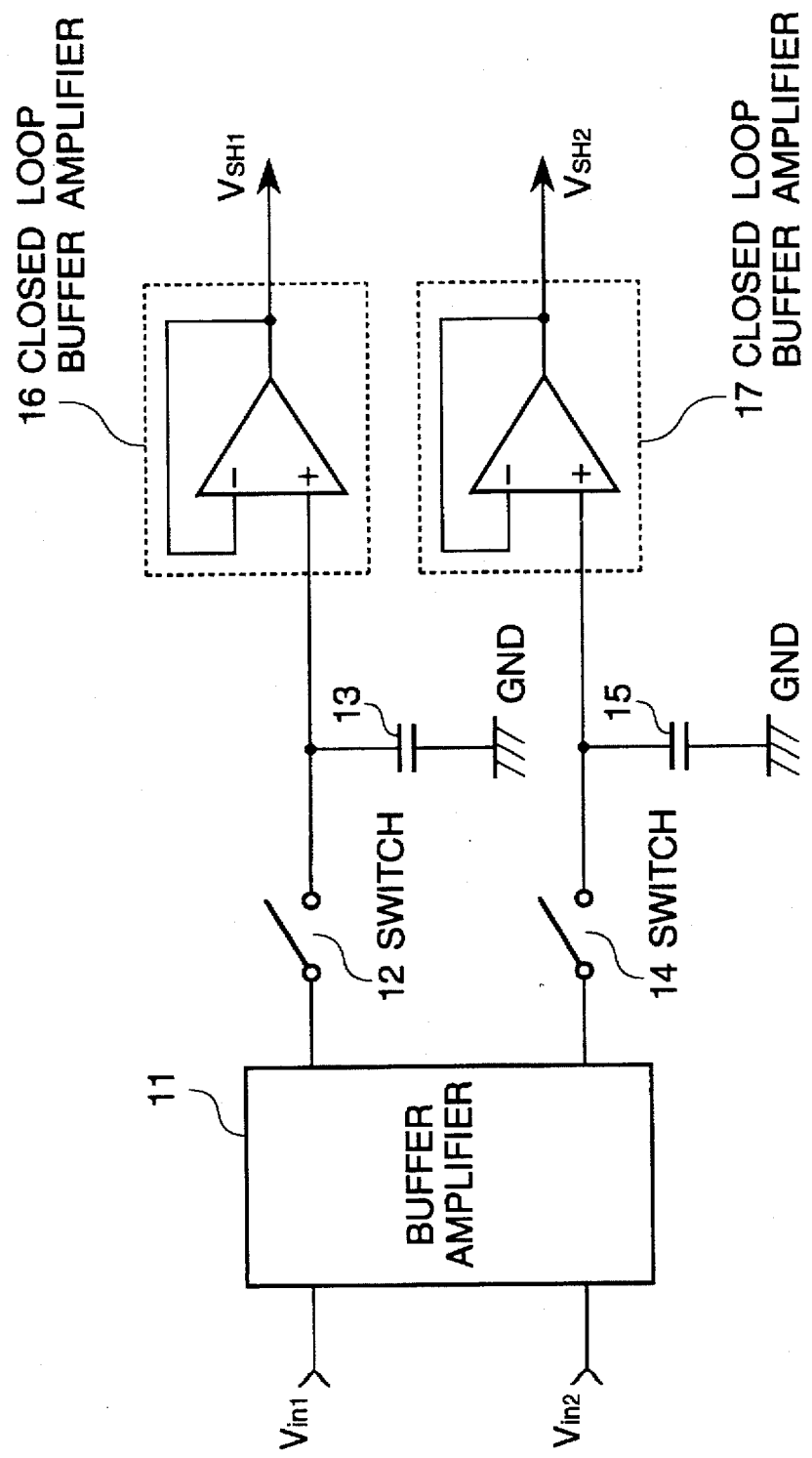
FIG. 3 is a circuit block diagram of a first embodiment of the differential sample-hold circuit in accordance with the present invention.

Referring to FIG. 3, there is shown a circuit block diagram of a first embodiment of the differential sample-hold circuit in accordance with the present invention. In FIG. 3, elements corresponding to those shown in FIG. 2 are given the same Reference Numerals.

The differential sample-hold circuit shown in FIG. 3 includes a differential buffer amplifier 11 having a non-inverting input terminal and an inverting input terminal receiving a first analog input voltage Vin1 and a second analog input voltage Vin2 of a pair of differential analog input voltages, respectively, a first switch 12 having one end connected to a non-inverted output of the differential buffer amplifier 11, and a second switch 14 having one end connected to an inverted output of the differential buffer amplifier 11. The first and second switches 12 and 14 have the same circuit construction. The sample-hold circuit also includes a first voltage holding capacitor 13 having its one end connected to the other end of the switch 12 and its other end connected to ground, a second voltage holding capacitor 15 having its one end connected to the other end of the switch 14 and its other end connected to ground, these first and second capacitors having the same capacitance, a first closed-loop buffer amplifier 16 having an input connected to the one end of the first voltage holding capacitor 13, and a second closed-loop buffer amplifier 17 having an input connected to the one end of the second voltage holding capacitor 15. Respective outputs of the first and second closed-loop buffer amplifiers 16 and 17 output a pair of differential sampled-and-held voltages VSH1 and VSH2, respectively.

Incidentally, each of the first and second closed-loop buffer amplifiers 16 and 17 is constituted of an operational amplifier connected in a voltage follower fashion in which an output terminal of the operational amplifier is connected to an inverting input terminal of the operational amplifier. In this case, a non-inverting input of the operational amplifier constitutes the input terminal of the closed-loop buffer.

Now, an operation of the sample-hold circuit shown in FIG. 3 will be described. The differential buffer amplifier 11 amplifies the analog input voltages Vin1 and Vin2 with a gain of "1", and outputs them to the switches 12 and 14. The switches 12 and 14 are closed and opened in synchronism with each other for the purpose of sampling the input voltages Vin1 and Vin2 and causing the sampled voltages to be held in the voltage holding capacitors 13 and 15.

More specifically, in an input voltage sampling period or mode, when the switches 12 and 14 are in a closed condition, the voltage holding capacitors 13 and 15 are charged or discharged to the analog input voltages Vin1 and Vin2, respectively, by action of the differential buffer amplifier 11 having its gain of 1.

In an input voltage holding period or mode, the switches 12 and 14 are opened, so that the analog voltages at the moment the switches 12 and 14 are brought into an open condition are held in the voltage holding capacitors 13 and 15, respectively. The sampled-and-held voltage of the voltage holding capacitors 13 and 15, are supplied from the closed-loop buffer amplifiers 16 and 17, under a small distortion, to the following full-parallel A/D converter 42 and the subtracter 44 shown in FIG. 1.

The following discussion explains why the sampled-and-held voltage of the voltage holding capacitors 13 and 15, are supplied from the closed-loop buffer amplifiers 16 and 17 under a small distortion.

Figure 1:
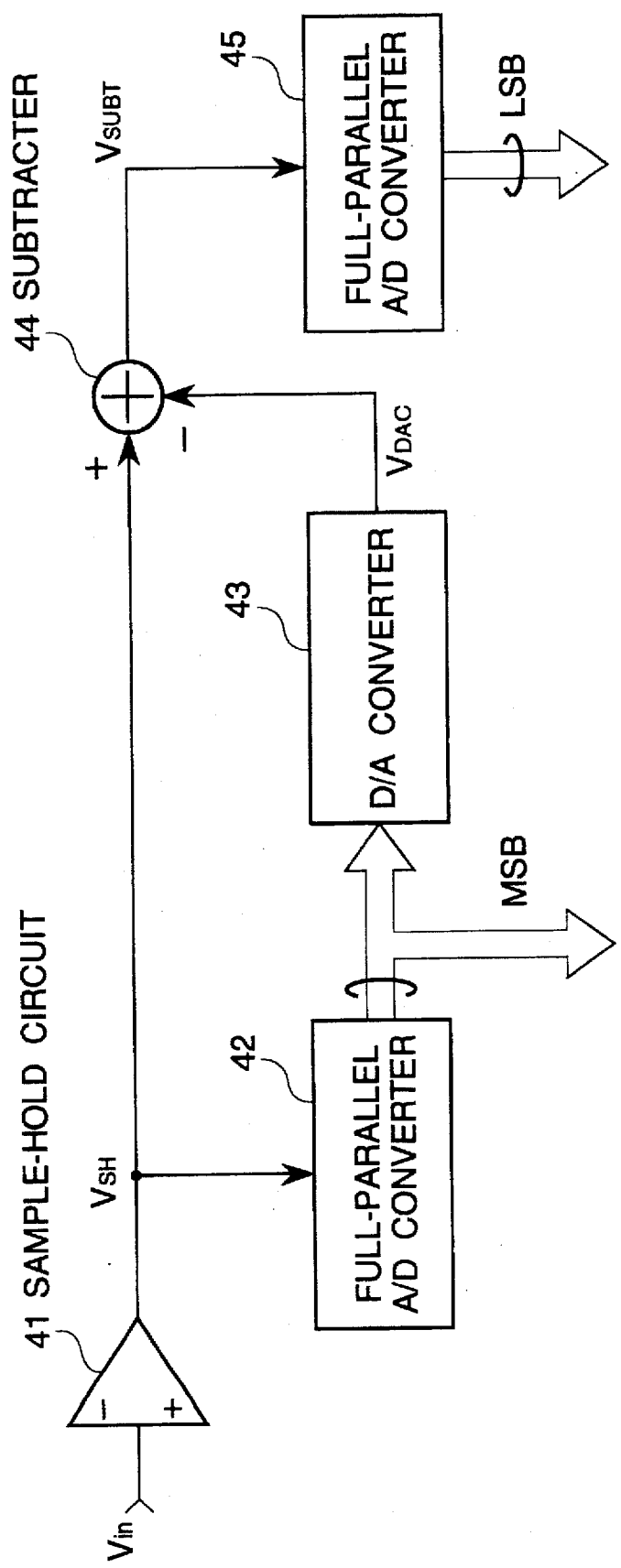
FIG. 1 is a circuit block diagram of one example of a conventional serial-parallel type A/D conversion circuit.

When the differential sample-hold circuit is used in the serial-parallel type A/D conversion circuit shown in FIG. 1, and when the D/A converter 43 used in the serial-parallel type A/D conversion circuit shown in FIG. 1 is of a unitary current added type, an output current of the D/A converter changes in accordance with the analog input voltages Vin1 and Vin2. Namely, a load current of the sample-hold circuit is caused to change through the analog subtracter 44. Here, in the case of the conventional sample-hold circuit in which the differential buffer amplifier is located before the differential output terminals of the sample-hold circuit, the load current of the sample-hold circuit varies upon a variation in the output current of the D/A converter. As a result, the signal distortion occurs in the output voltage of the sample-hold circuit. In the shown embodiment, however, since the load current of the sample-hold circuit is supplied by the closed-loop buffer amplifiers 16 and 17, the feedback action of the closed-loop buffer amplifiers 16 and 17 instantaneously compensates the variation of the output voltage of the sample-hold circuit caused by the load current variation. Accordingly, it is possible to minimize the signal distortion which would otherwise occur in the output voltages VsH1 and VsH2 of the sample-hold circuit.

Figure 4:
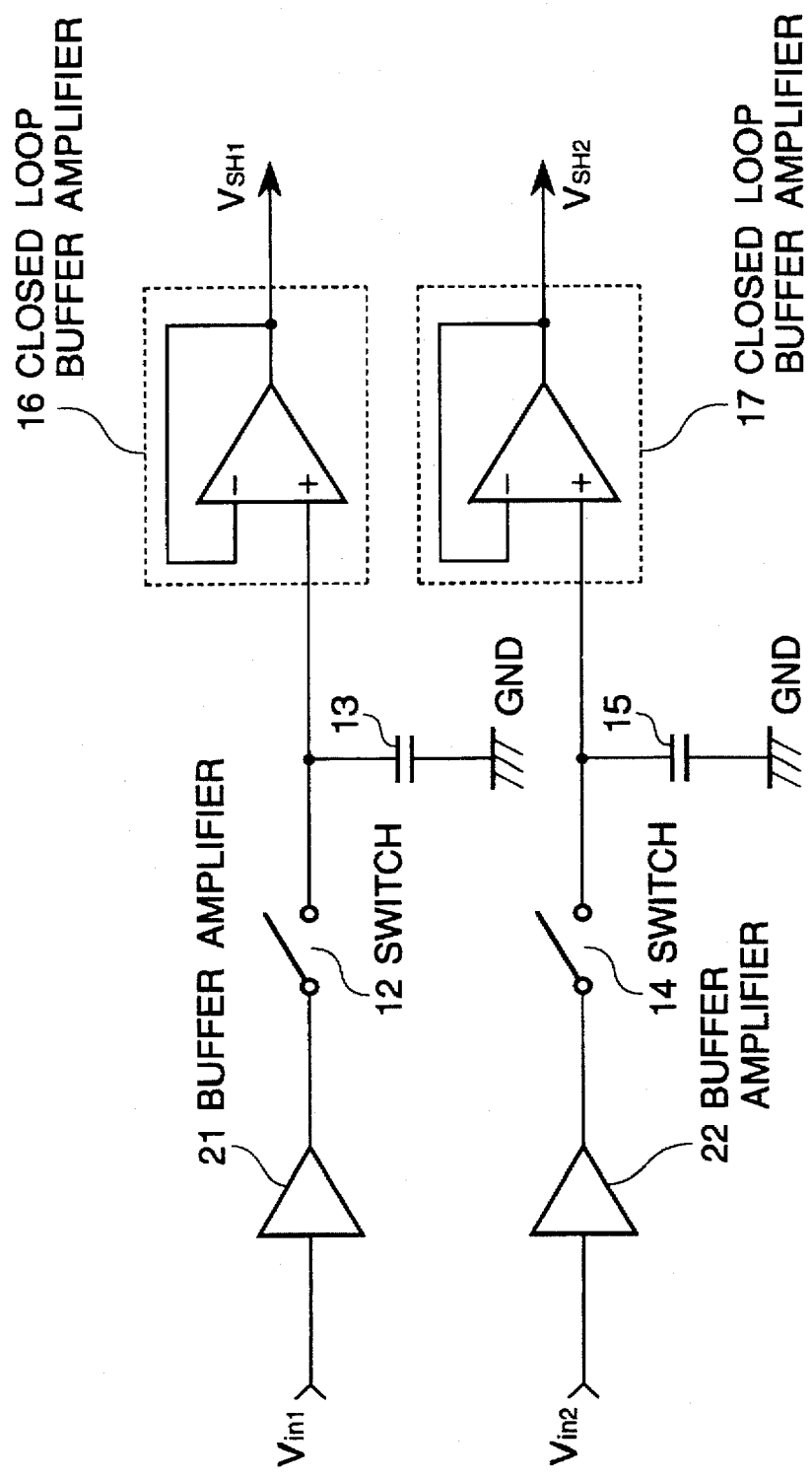
FIG. 4 is a circuit block diagram of a second embodiment of the differential sample-hold circuit in accordance with the present invention.
Figure 5:
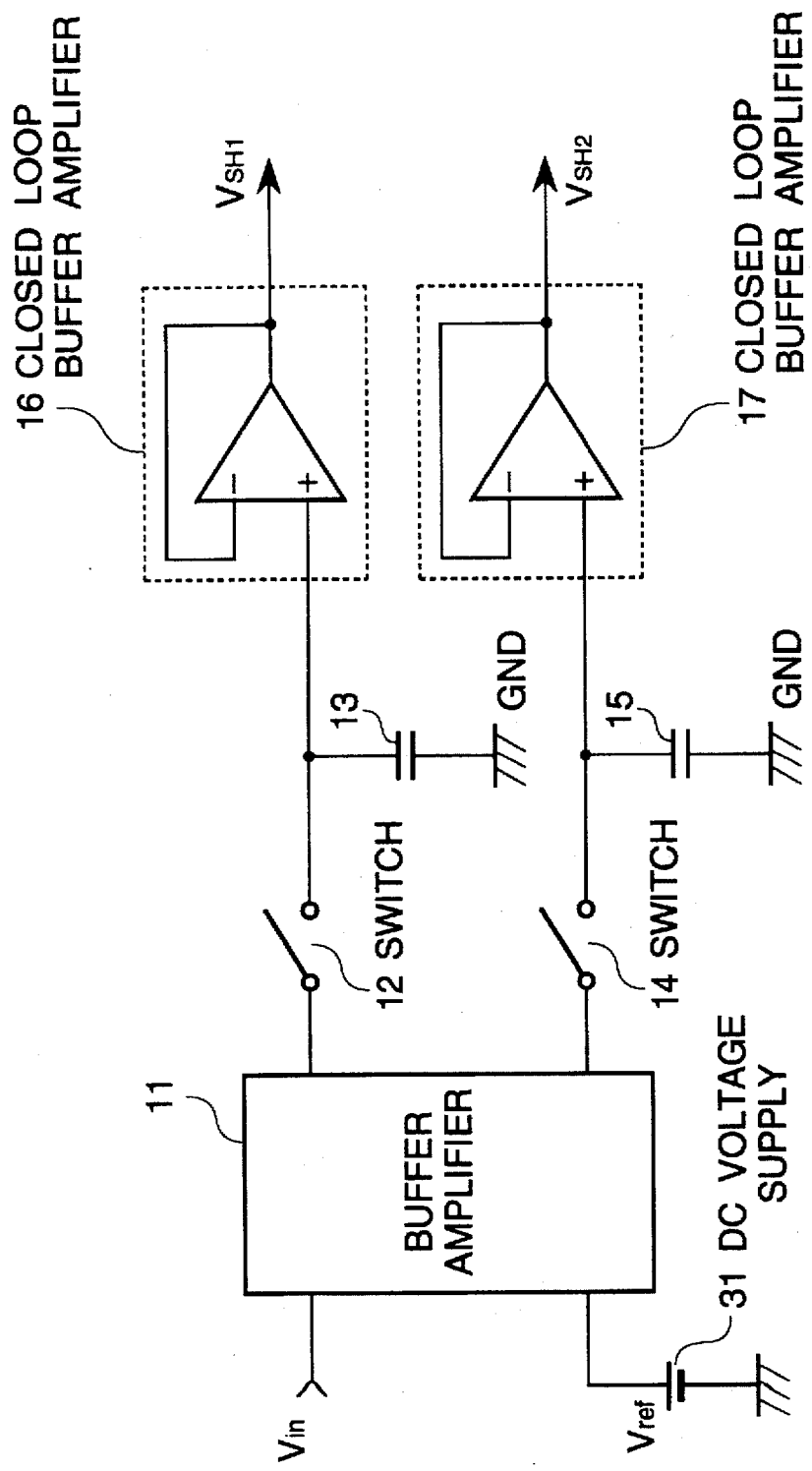
FIG. 5 is a circuit block diagram of a third embodiment of the differential sample-hold circuit in accordance with the present invention.

Referring to FIGS. 4 and 5, there are shown is a circuit block diagram of second and third embodiments of the differential sample-hold circuit in accordance with the present invention. The second and third embodiments are very similar in construction to the first embodiment shown in FIG. 3 and are completely the same as the first embodiment in function. In the following, therefore, only differences between the first embodiment and each of the second and third embodiments will be described.

The second embodiment shown in FIG. 4 is different from the first embodiment shown in FIG. 3, in which two buffer amplifiers 21 and 22 are substituted for the differential buffer amplifier 11 used as an input buffer amplifier. An input of the amplifiers 21 and 22 are connected to receive the input analog voltages Vin1 and Vin2, respectively, and an output of the amplifiers 21 and 22 are connected to the input terminals of the switches 12 and 14, respectively.

Incidentally, the buffer amplifiers are ordinarily constituted of an emitter follower or a source follower.

With this arrangement, since the switches 12 and 14, the voltage holding capacitors 13 and 15 and the closed-loop buffer amplifiers 16 and 17, which are located after the buffer amplifiers 21 and 22, operate similarly to corresponding ones of the first embodiment, the output distortion can be minimized similarly to the first embodiment.

The third embodiment shown in FIG. 5 is a modification of the first embodiment adapted to an single-ended input, in place of the differential input.

In the third embodiment, a single-ended analog input voltage Vin is applied to the non-inverting input of the differential buffer amplifier 11, and the inverting input of the differential buffer amplifier 11 is connected to a direct current reference voltage Vref supplied from a DC voltage supply 31. In this third embodiment, the reference voltage Vref is set to an intermediate voltage of an operating range of the analog input voltage Vin. Thus, the differential buffer amplifier 11 amplifies an analog voltage difference {Vin−Vref} with a gain of "1" so as to supply it to the input end of the switches 12 and 14.

With this arrangement, since the switches 12 and 14, the voltage holding capacitors 13 and 15 and the closed-loop buffer amplifiers 16 and 17, which are located after the buffer amplifier 11, operate similarly to corresponding ones of the first embodiment, the output distortion can be minimized similarly to the first embodiment.

The invention has thus been shown and described with reference to the specific embodiments. However, it should be noted that the present invention is in no way limited to the details of the illustrated structures but changes and modifications may be made within the scope of the appended claims.

I claim:

1. A differential sample-hold circuit comprising:
    a buffer amplifier having first and second input terminals for receiving a pair of analog input voltages, and first and second output terminals;
    a first switch having an input terminal connected to said first output terminal of said buffer amplifier;
    a second switch having an input terminal connected to said second output terminal of said buffer amplifier;
    a first voltage holding capacitor having one end connected to an output terminal of said first switch and an other end connected to ground;
    a second voltage holding capacitor having one end connected to an output terminal of said second switch and an other end connected to the ground;
    a first closed-loop buffer amplifier having an input terminal connected to said one end of said first voltage holding capacitor, and an output terminal constituting a first output terminal for a first sampled-and-held value; and
    a second closed-loop buffer amplifier having an input terminal connected to said one end of said second voltage holding capacitor, and an output terminal constituting a second output terminal for a second sampled-and-held value;
    wherein said first and second closed-loop buffer amplifiers simultaneously operate to drive a load connected to said first and second output terminals.

2. A differential sample-hold circuit claimed in claim 1, wherein said first and second input terminals of said buffer amplifier are a non-inverting input terminal and an inverting input terminal, respectively, and said first and second output terminals of said buffer amplifier are a non-inverted output terminal and an inverted output terminal, respectively.

3. A differential sample-hold circuit claimed in claim 1, wherein said buffer amplifier includes first and second buffer amplifier circuits, said first input terminal and said first output terminal of said buffer amplifier being constituted of an input terminal and an output terminal of said first buffer amplifier circuit, respectively, and said second input terminal and said second output terminal of said buffer amplifier being constituted of an input terminal and an output terminal of said second buffer amplifier circuit, respectively.

4. A differential sample-hold circuit claimed in claim 1, wherein each of said closed-loop buffer amplifiers includes operational amplifier which has a non-inverting input constituting said input terminal of the closed-loop buffer amplifier, and which is connected in a voltage follower fashion in which an output terminal of the operational amplifier is connected to an inverting input terminal of the operational amplifier.

5. A differential sample-hold circuit claimed in claim 4, wherein said first switch and said second switch are switched on and off at identical times, and wherein said first voltage holding capacitor and said second voltage holding capacitor have identical voltage charging/discharging periods and voltage holding periods.

6. A differential sample-hold circuit claimed in claim 5, wherein said first and second outputs of said buffer amplifier correspond to differential outputs.

7. A differential sample-hold circuit claimed in claim 1, wherein said first switch and said second switch are switched on and off at identical times, and wherein said first voltage holding capacitor and said second voltage holding capacitor have identical voltage charging/discharging periods and voltage holding periods.

8. A differential sample-hold circuit claimed in claim 7, wherein said first and second outputs of said buffer amplifier correspond to differential outputs.

9. A differential sample-hold circuit claimed in claim 1, wherein said first and second outputs of said buffer amplifier correspond to differential outputs.

10. A serial-parallel type A/D conversion circuit including:
   a sample-hold circuit receiving a pair of differential analog input voltages;
   a first A/D converter having an input connected to receive an output of said sample-hold circuit and an output for generating a first digital output for a most significant part;
   a current-added type D/A converter having an input connected to said output of said first A/D converter and an output for outputting an analog signal obtained from said first digital output;
   an analog subtracter having a positive input terminal connected to said output of said sample-hold circuit and a negative input terminal connected to said output of said D/A converter, for outputting an analog difference voltage; and
   a second A/D converter having an input connected to receive said analog difference voltage from said subtracter and an output for generating a second digital output for a least significant part,
   wherein a combination of said first and second digital outputs is indicative of a complete digital data precisely corresponding to said pair of differential analog input voltages,
   the improvement being in that said sample-hold circuit comprises:
      a buffer amplifier having first and second input terminals for receiving said pair of differential analog input voltages, and said buffer amplifier having first and second output terminals;
      a first switch having an input terminal connected to said first output terminal of said buffer amplifier;
      a second switch having an input terminal connected to said second output terminal of said buffer amplifier;
      a first voltage holding capacitor having one end connected to an output terminal of said first switch and an other end connected to ground;
      a second voltage holding capacitor having one end connected to an output terminal of said second switch and an other end connected to the ground;
      a first closed-loop buffer amplifier having an input terminal connected to said one end of said first voltage holding capacitor, and an output terminal constituting a first output terminal for a sampled-and-held value; and
      a second closed-loop buffer amplifier having an input terminal connected to said one end of said second voltage holding capacitor, and an output terminal constituting a second output terminal for a sampled-and-held value;
      wherein said first and second closed-loop buffer amplifiers simultaneously operate to drive a load connected to said sample-hold circuit.

11. A serial-parallel type A/D conversion circuit claimed in claim 10, wherein said first and second input terminals of said buffer amplifier are a non-inverting input terminal and an inverting input terminal, respectively, and said first and second output terminals of said buffer amplifier are a non-inverted output terminal and an inverted output terminal, respectively.

12. A serial-parallel type A/D conversion circuit claimed in claim 10, wherein said buffer amplifier includes first and second buffer amplifier circuits, said first input terminal and said first output terminal of said buffer amplifier being constituted of an input terminal and an output terminal of said first buffer amplifier circuit, respectively, and said second input terminal and said second output terminal of said buffer amplifier being constituted of an input terminal and an output terminal of said second buffer amplifier circuit, respectively.

13. A serial-parallel type A/D conversion circuit claimed in claim 10, wherein each of said closed-loop buffer amplifiers includes an operational amplifier which has a non-inverting input constituting said input terminal of the closed-loop buffer amplifier, and which is connected in a voltage follower fashion in which an output terminal of the operational amplifier is connected to an inverting input terminal of the operational amplifier.

14. A serial-parallel type A/D conversion circuit claimed in claim 13, wherein said first switch and said second switch are switched on and off at identical times, and wherein said first voltage holding capacitor and said second voltage holding capacitor have identical voltage charging/discharging periods and voltage holding periods.

15. A serial-parallel type A/D conversion circuit claimed in claim 14, wherein said first and second outputs of said buffer amplifier correspond to differential outputs.

16. A serial-parallel type A/D conversion circuit claimed in claim 10, wherein said first switch and second switch are switched on and off at identical times, and wherein said first voltage holding capacitor and said second voltage holding capacitor have identical voltage charging/discharging periods and voltage holding periods.

17. A serial-parallel type A/D conversion circuit claimed in claim 16, wherein said first and second outputs of said buffer amplifier correspond to differential outputs.

18. A serial-parallel type A/D conversion circuit claimed in claim 10, wherein said first and second outputs of said buffer amplifier correspond to differential outputs.

* * * * *